(12) United States Patent
Lu et al.

(10) Patent No.: US 8,867,175 B1
(45) Date of Patent: Oct. 21, 2014

(54) MAGNETIC SHIELD BASE LAMINATION

(71) Applicant: Seagate Technology LLC, Cupertino, CA (US)

(72) Inventors: Zhengqi Lu, Londonderry (GB); Daniel Hassett, Newtowncunningham (IE); Jiansheng Xu, Londonderry (GB)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/889,841

(22) Filed: May 8, 2013

(51) Int. Cl.
G11B 5/127 (2006.01)
G11B 5/11 (2006.01)

(52) U.S. Cl.
CPC .................................. G11B 5/11 (2013.01)
USPC ........................................................ 360/319

(58) Field of Classification Search
USPC .................. 360/319, 316, 314, 313
See application file for complete search history.

(56) References Cited

U.S. PATENT DOCUMENTS

| | | | |
|---|---|---|---|
| 5,515,221 A | 5/1996 | Gill et al. | |
| 5,666,250 A | 9/1997 | Stageberg et al. | |
| 6,169,646 B1 | 1/2001 | Macken et al. | |
| 6,801,409 B2 | 10/2004 | Michel et al. | |
| 7,031,122 B2 | 4/2006 | Pust et al. | |
| 7,082,016 B2 | 7/2006 | Pust et al. | |
| 7,606,007 B2 | 10/2009 | Gill | |
| 8,189,303 B2 | 5/2012 | Hara et al. | |
| 8,194,360 B2 | 6/2012 | Macken et al. | |
| 8,462,461 B2* | 6/2013 | Braganca et al. | 360/125.3 |
| 2002/0131202 A1* | 9/2002 | Westwood | 360/110 |
| 2003/0081359 A1* | 5/2003 | Pust et al. | 360/319 |
| 2006/0209470 A1* | 9/2006 | Ohta et al. | 360/319 |
| 2007/0139826 A1* | 6/2007 | Carey et al. | 360/319 |
| 2007/0281079 A1* | 12/2007 | Carey et al. | 427/131 |
| 2008/0042779 A1* | 2/2008 | Carey et al. | 333/167 |
| 2010/0027168 A1 | 2/2010 | Chou et al. | |
| 2013/0009712 A1* | 1/2013 | Braganca et al. | 331/94.1 |
| 2013/0128381 A1* | 5/2013 | Okamura et al. | 360/75 |

* cited by examiner

*Primary Examiner* — Allen T Cao
(74) *Attorney, Agent, or Firm* — Hall Estill Attorneys at Law

(57) ABSTRACT

A magnetic element may generally be configured as a read head with at least a magnetic stack that contacts at least one magnetic shield. The magnetic shield can be positioned on top of a base lamination and have at least a predetermined anisotropy and magnetic coercivity corresponding to the base lamination.

20 Claims, 5 Drawing Sheets

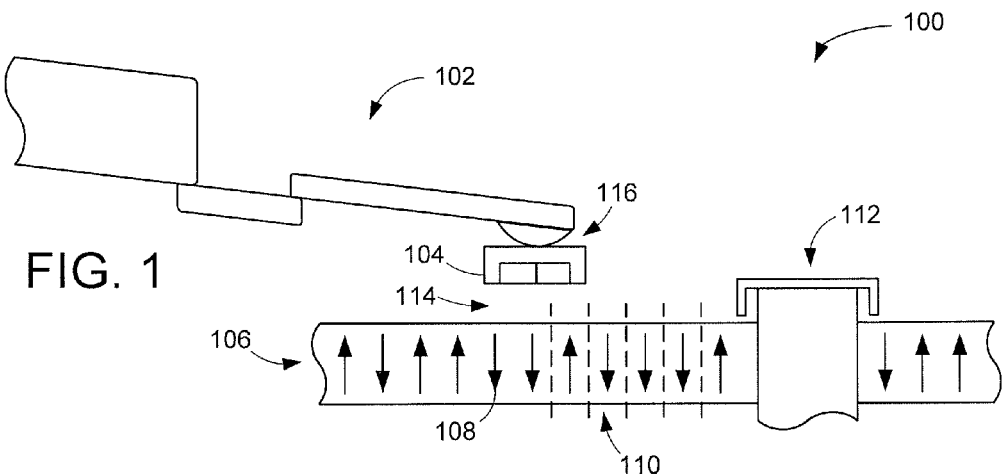
FIG. 1
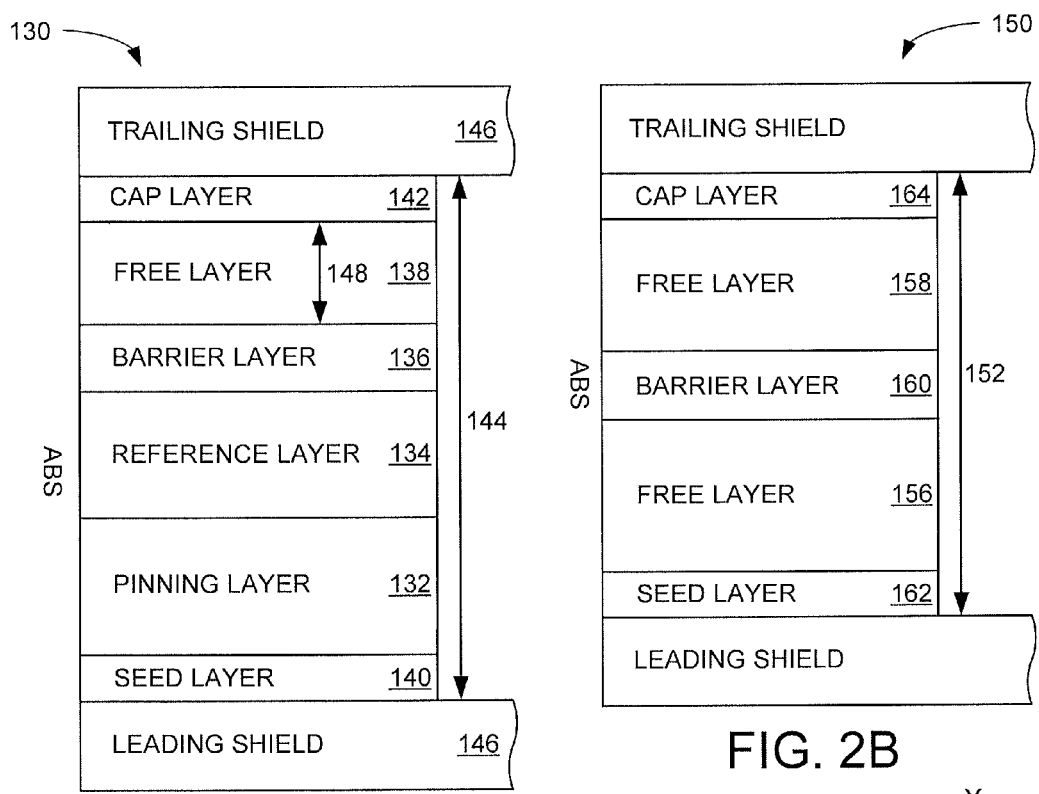
FIG. 2A
FIG. 2B
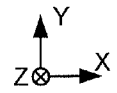

MAGNETIC SHIELD BASE LAMINATION

SUMMARY

Various embodiments are generally directed to a data reading element capable of sensing data bits from a variety of data storage environments.

In accordance with various embodiments, a magnetic stack may contact at least one magnetic shield. The magnetic shield can be positioned on top of a base lamination and have at least a predetermined anisotropy and magnetic coercivity corresponding to the base lamination.

BRIEF DESCRIPTION OF THE DRAWINGS

FIG. 1 is a block representation of an example portion of a data storage device configured and operated in accordance with some embodiments.

FIGS. 2A and 2B respectively show cross-sectional portions of example magnetic elements capable of being used in the data storage element of FIG. 1.

DETAILED DESCRIPTION

Figure 3:
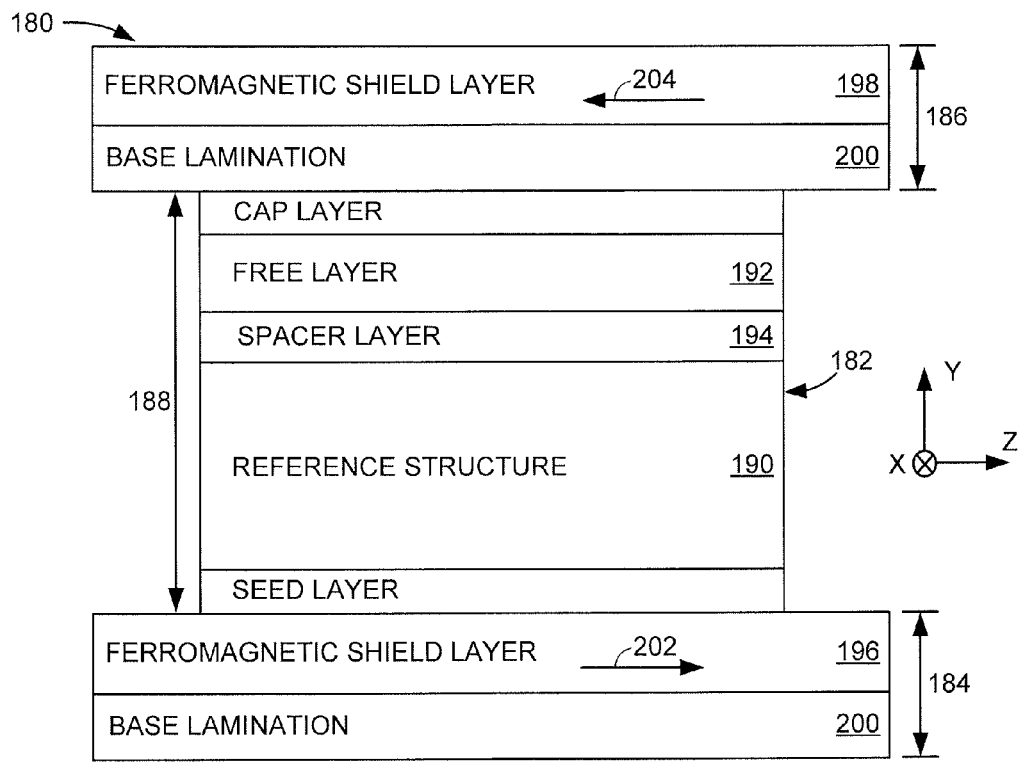
FIG. 3 displays an air bearing view block representation of an example magnetic element constructed in accordance with various embodiments.

Magnetoresistive (MR) devices can be used in magnetic data storage environments to detect magnetically encoded information as time dependent magnetic fields that directly modulate the resistivity of the MR device and can be sensed to decode the information. A continued emphasis on high storage capacity data storage devices has brought data bits closer together and caused magnetic components, like reference structures and shields, to be reduced in physical size to be able to discern individual data bits. Such physical size reduction can make an MR device susceptible to magnetic noise and instability as magnetic component magnetizations are minimized. The vulnerability to noise and instability can be exploited by the increased presence of stray magnetic fields that corresponds with heightened data bit density. Hence, there is an ongoing goal of the data storage industry to make reduced physical size magnetic components more robust to magnetic noise.

Accordingly, a read head can employ a magnetic stack that contacts at least one magnetic shield that is positioned on top of a base lamination that provides a predetermined anisotropy and magnetic coercivity to the magnetic shield. The tuned configuration of the base lamination that corresponds with optimized anisotropy and magnetic coercivity can mitigate magnetic domain wall movement and Barkhausen noise in the magnetic shield in response to encountered stray magnetic fields. The ability to provide a predetermined anisotropy and magnetic coercivity with the base lamination further allows a reduced physical size of the magnetic shield to be accounted for and the magnetizations of the magnetic shield to be maintained in the presence of high data bity density.

While shields with tuned anisotropy and magnetic coercivity can be utilized in a wide variety of device and data storage environments, FIG. 1 displays a block representation of a portion of an example data storage device 100 that may employ at least one tuned magnetic shield in accordance with various embodiments. Through controlled actuation of an actuator 102, a transducing head 104 can be moved over a variety of locations on a magnetic storage media 106 where stored data bits 108 are positioned in predetermined patterns, such as radially concentric tracks 110 or bit patterns (BPM). Movement of the storage media 106 can be facilitated through attachment to one or more spindle motors 112 that rotate during use to produce an air bearing 114 on which the transducing head 104 flies.

The transducing head 104 can be configured with one or more transducing elements, such as a magnetic writer, magnetically responsive reader, and magnetic shields, which operate to program and read data from the selected data bits 108 of the storage media 106, respectively. In this way, controlled motion of the storage media 106 and transducing head 104 can align a data writer or reader with the data bits 108 defined on the storage media 106 to write, read, and rewrite data. As data bits 108 become more densely packed on the storage media 106, scaling the physical size of the magnetic stack portion of the transducing head 104 can increase data bit resolution, but may correspond with degraded performance due to the decreased physical size.

FIGS. 2A and 2B respectively show example magnetic stacks 130 and 150 each capable of being used in the data storage device 100 of FIG. 1. It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits. For example, but not in any way limiting, a magnetic stack may be a data reader that can differentiate between a plurality of data bits.

FIG. 2A illustrates a spin valve magnetic stack 130 that has a fixed magnetization pinning layer 132 contacting a fixed magnetization reference layer 134 opposite a non-magnetic barrier layer 136 from a magnetically free layer 138. As the free layer 138 responds to an external data bit while the reference layer 134 maintains a fixed magnetization due to the exchange coupling with the pinning layer 132, an external data bit can be read as a logic state. Through various tuned configurations, seed 140 and cap 142 layers can be positioned on opposite sides of the stack 130 to provide predetermined fixed and/or free magnetizations and other magnetic characteristics like grain growth and anisotropy.

Construction of the spin valve magnetic stack 130 can have a distance 144 between shields 146 and free layer thickness 148 that determines the magnetic extent of the stack 130 and the possible data track resolution. However, the inclusion of the reference 136 and pinning 134 layers can correspond to a smaller free layer thickness 148 and increased shield-to-shield spacing 144 that may reduce data signal production between the free 138 and reference 134 layers. In contrast, the trilayer stack 150 of FIG. 2B may be used to read data bits with a reduced shield-to-shield spacing 152 and greater free layer thickness 154 compared to the spin valve magnetic stack 130.

In operation, the trilayer stack 150 has first 156 and second 158 magnetically free layers that are separated by a barrier layer 160 and set to default magnetizations by biasing structures external to the trilayer stack 150. The relocation of any pinned magnetization structures from the stack 150 to elsewhere allow for the reduced physical size 152 compared to the pinning 132 and reference 134 magnetizations of the spin valve magnetic stack 130. However, the lack of any pinned magnetization in the trilayer stack 150 can be difficult to bias properly to read data from densely packed data bits.

Regardless of the type of magnetic stack being used, the magnetic characteristics of the various layers are stressed as shield-to-shield spacing decreases. Such stress is mitigated by magnetic shields positioned about the magnetic stack, like leading and trailing shields of FIGS. 2A and 2B as well as side shields that are not shown. However, shields often are formed of low magnetic coercivity materials that provide efficient shielding of errant magnetic fields, but can saturate in response to those errant magnetic fields and become volatile to the point of inadvertently translating magnetic domain walls and inducing Barkhausen noise into the magnetic stack. As such, the combination of induced noise and diminished magnetic stability in the magnetic stack due to reduced physical dimensions can degrade stack operation by effecting data sensing accuracy and efficiency.

With these issues in mind, means for stabilizing magnetic shields without decreasing the shielding capabilities of the material is a continued industry goal. FIG. 3 provides an air bearing block representation of a portion of an example read head 180 constructed in accordance with some embodiments to provide robust shielding and enhanced stability due to tuned uniaxial anisotropy. The read head 180 has a magnetic stack 182 disposed between leading 184 and trailing 186 shields. The reduction of the shield-to-shield spacing 188 can minimize the amplitude of magnetizations in the reference structure 190 and free layer 192, which can correspond with a decreased data signal as measured across the non-magnetic spacer layer 194. Such minimized magnetization amplitude is further inhibited by magnetic noise resulting from domain wall movement of the ferromagnetic shield layers 196 and 198.

The formation of each ferromagnetic shield layer 196 and 198 atop a base lamination 200 can allow the magnetic characteristics of the respective base laminations 200 to provide a predetermined magnetic coercivity and uniaxial anisotropy for each ferromagnetic shield layer 196 and 198. For example, a base lamination 200 employing a tuned magnetic coupling like antiferromagnetic coupling across a non-magnetic spacer layer, can provide shield coercivity of 1.0 Oersted or less and anisotropy of approximately 8.0 Oersted. In contrast, a shield layer formed of NiFe or NiFeCr on a non-coupled base may have 1.0 Oersted coercivity and 5.0 Oersted or less anisotropy that is not conducive to maintaining predetermined magnetic shield magnetization orientations 202 and 204 in a high stray magnetic field environment.

Figure 4:
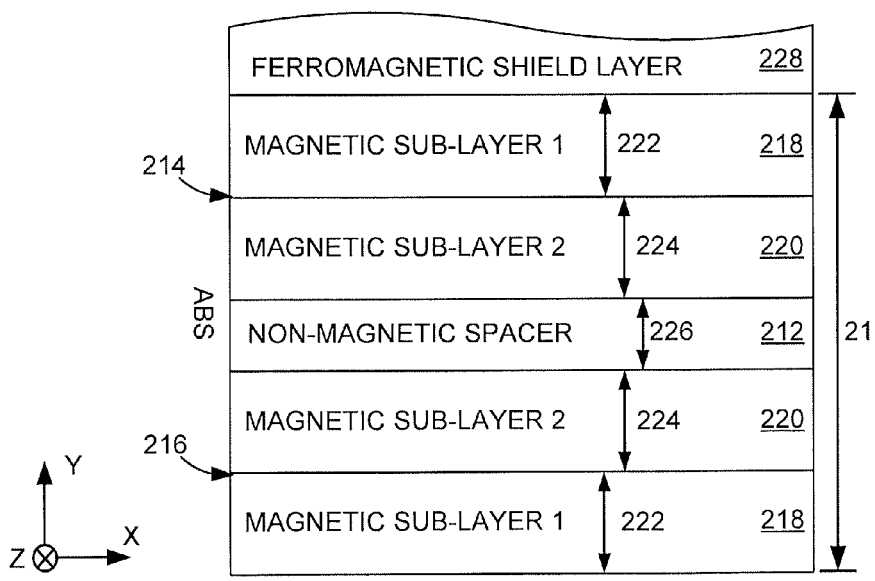
FIG. 4 shows a cross-sectional portion of an example magnetic element constructed in accordance with some embodiments.

FIG. 4 generally illustrates a cross-section block representation of a base lamination 210 portion of an example read head. The base lamination 210 has a non-magnetic spacer layer 212 disposed between a pair of bilayers 214 and 216 that each consist of a first 218 and second 220 magnetic sub-layers. As shown, the second magnetic sub-layer 220 of each bilayer 214 and 216 contacts opposite sides of the non-magnetic spacer layer 212. However, various embodiments may contact one, or both, sides of the spacer layer 212 with the first magnetic sub-layers 218.

The thicknesses 222, 224, and 226 of the respective first magnetic sub-layer 218, second magnetic sub-layer 220, and spacer layer 212 can be tuned to be similar or dissimilar to provide predetermined magnetic coupling types and strengths within and between the bilayers 214 and 216. Such tuned coupling can provide concurrent exchange coupling between the first 218 and second 220 magnetic sub-layers and antiferromagnetic coupling between the bilayers 214 and 216 across the spacer layer 212. It can be appreciated that by varying magnetic materials and thicknesses between the magnetic sub-layers 218 and 220 the magnetic coupling can be optimized. For instance, the thicknesses of the first 218 and second 220 magnetic sub-layers can be the same while different materials are used to tune the magnetic coupling of the base lamination 210.

In some embodiments, the first magnetic sub-layers 218 are each constructed with a metal alloy like NiFe, NiFeCr, NiFeMo, NiFeW, CoNiFe, and CoZrNb with a thickness 222 of 10-100 nm while the second magnetic sub-layers 220 are each formed of a different metal alloy, such as CoFe, CoNiFe, and CoFeB, with a second thickness 224 of 1-20 nm and the spacer layer 212 is configured as a non-magnetic metal like Ru, Cr, Cu, and Mo that has a third thickness 226 of 0.3-2 nm. These non-limiting examples illustrate how the structure of the base lamination 210 can be tuned in a wide variety of different configurations to provide a predetermined magnetic coupling that corresponds with fixed magnetizations for each bilayer 214 and 216.

The ability to tune the base lamination 210 to have more than one different type of magnetic coupling can allow a ferromagnetic shield layer 228 to be plated on top of the base lamination 210 with predetermined magnetic coercivity and uniaxial anisotropy. That is, the predetermined exchange and antiferromagnetic coupling within and between the bilayers 214 and 216 can produce a particular uniaxial anisotropy and magnetic coercivity in the ferromagnetic shield layer 228 grown atop the base lamination 210. As the ferromagnetic shield layer 228 is plated, the fixed magnetizations of the bilayers 214 and 216 provided by the magnetic coupling within the base lamination 210 serve to align grains of the ferromagnetic shield material to produce uniaxial anisotropy without increasing the magnetic coercivity of the material.

Figure 5:
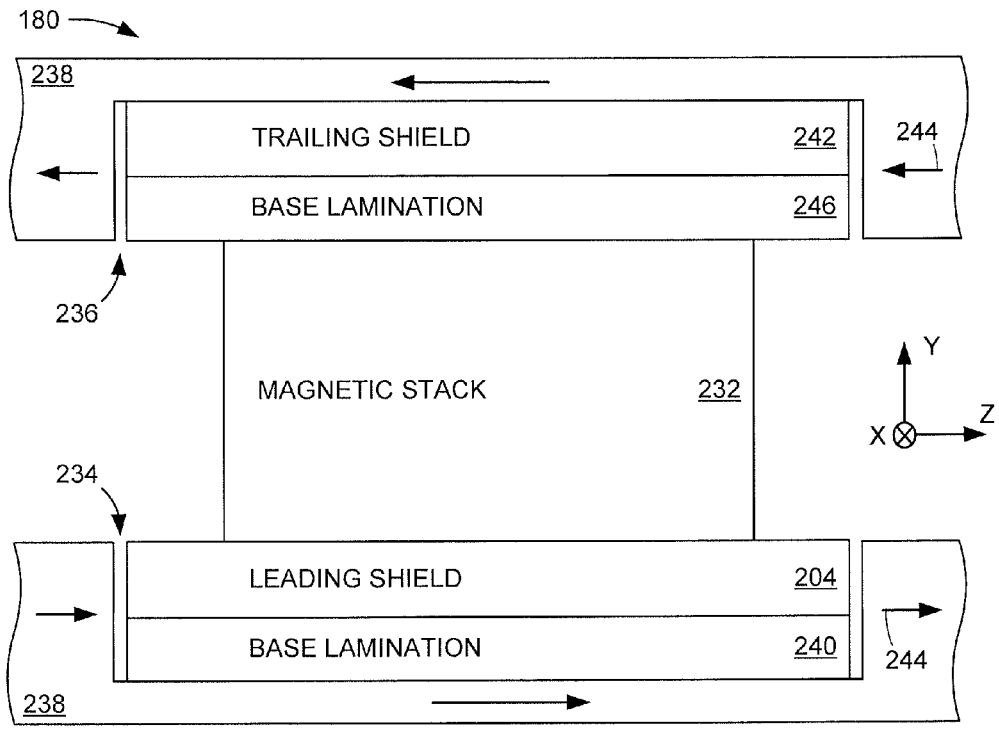
FIG. 5 illustrates an air bearing view block representation of an example magnetic element constructed in accordance with various embodiments.

While the tuned construction of the base lamination 210 can provide predetermined magnetic coupling types having predetermined strengths, the diminishing physical size of read heads can minimize the magnetization strength and stability of the base lamination 210 and shield layer 228. FIG. 5 shows an air bearing block representation of an example read head 230 configured with increased magnetic shield stabilization in accordance with various embodiments. A magnetic stack 232 contacts leading 234 and trialing 236 shields that each have a domain control structure (DCS) 238 that continuously extends to opposite lateral sides of the magnetic stack 232 along the Z axis to aid in stabilizing the respective shields 234 and 236. One DCS 238 can be configured to contact the base lamination 240 of the leading shield 234 while the other DCS 238 contacts the ferromagnetic shield layer 242 of the trailing shield 236 to exchange couple and stabilize the respective shields 234 and 236.

As displayed, each DCS 238 can contact the respective shields 234 and 236 with an area of reduced thickness while the DCS 238 extends on the lateral sides of the shields 234 and 236 up to the magnetic stack 232 with an increased thickness, as measures along the Y axis. The tuned magnetization 244 orientation and strength of the DCS 238 can aid the base laminations 240 and 246 in providing the ferromagnetic shield layers 242 and 246 of the respective magnetic shields 234 and 236 with magnetic stabilization. In some embodiments, the DCS magnetizations 244 can be tuned to bias the shields 234 and 236, the magnetic stack 232, and the base laminations 240 and 246 by being constructed of one or more magnetic layers that may be dissimilar materials and thicknesses, much like the base lamination 210 of FIG. 4, to provide the magnetization 244 with predetermined orientation and strength.

Figure 6:
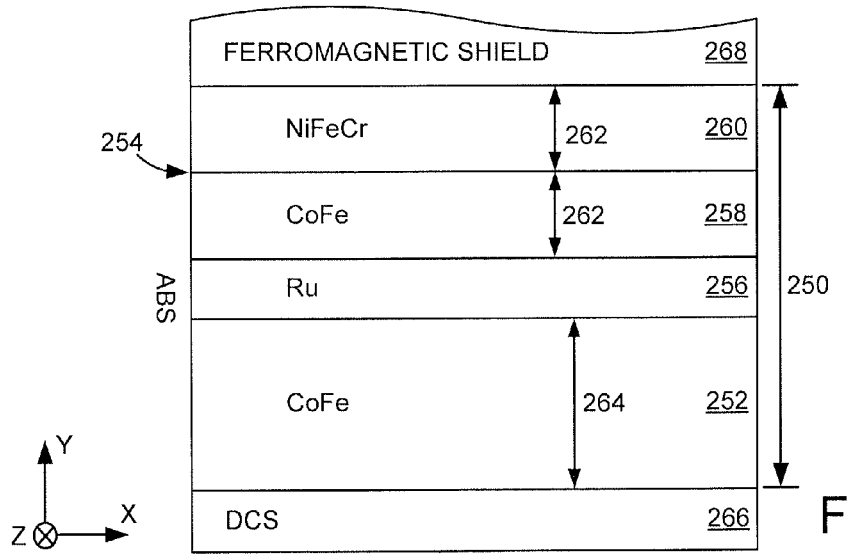
FIG. 6 provides a cross-sectional portion of an example magnetic element constructed in accordance with some embodiments.

While not required, an example base lamination 250 portion of a read head employing at least one DCS is shown as a cross-section block representation in FIG. 6. The base lamination 250 is configured with a bilayer 252 separated from a single CoFe magnetic layer 254 by a non-magnetic spacer layer 256 of ruthenium. The CoFe material of the magnetic layer 252 is matched by the first magnetic sub-layer 258 of the bilayer 254 while the second magnetic sub-layer 260 is constructed of NiFeCr to provide predetermined exchange coupling with the CoFe of the first sub-layer 258. The material selection that contributes to the magnetic coupling within the base lamination 250 is complemented by the tuned thickness configuration of the respective constituent layers, which can form the bilayer 254 sub-layers 258 and 260 with a common thickness 262 that matches the thickness 264 of the magnetic layer 252 in the aggregate, as displayed.

With the base lamination 250 contacting the DCS 266 and receiving magnetization therefrom, the single magnetic layer 252 can be tuned with a larger thickness 264, and without additional magnetic sub-layers like bilayer 254, while providing concurrent exchange and antiferromagnetic coupling on opposite sides of the spacer layer 256. That is, the magnetization of the DCS 266 may operate as a magnetic sub-layer via contact with the magnetic layer 252 to allow the magnetic layer 252 to be larger and provide a greater antiferromagnetic coupling strength for fabrication of the ferromagnetic shield layer 268. It should be noted, however, that the materials and thicknesses of the base lamination 250 are not required or limiting in any way as any number of pure metals, metal alloys, and non-magnetic materials can be configured into any number of base lamination 250 layers.

Figure 7:
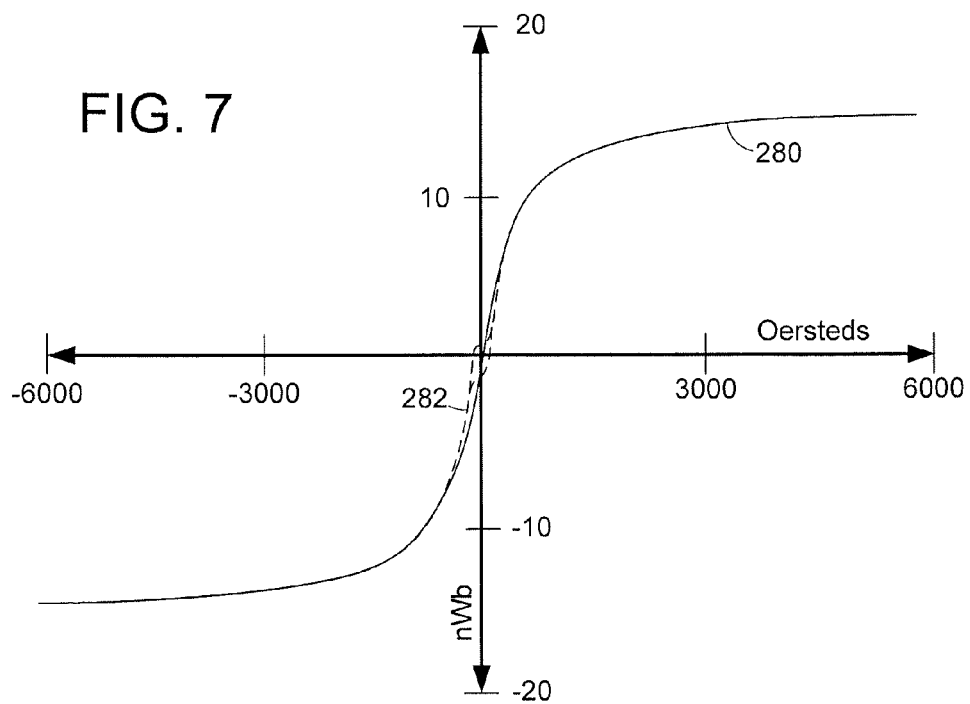
FIG. 7 graphs operational data from a variety of example magnetic elements constructed an operated in accordance with various embodiments.

Through the tuned selection of materials, thicknesses, and number of layers, the base lamination 250 can provide magnetic coupling that corresponds with a predetermined magnetic coercivity and uniaxial anisotropy in a ferromagnetic shield layer plated thereon. FIG. 7 plots a hysteresis loop for an example base lamination tuned in accordance with various embodiments. Solid line 280 and segmented line 282 correspond with hard and easy axis with applied magnetic fields respectively oriented parallel and perpendicular to an air bearing. It can be appreciated that the tuned materials and thicknesses of the base lamination can provide optimized magnetic shield performance with minimal deviation between the easy 280 and hard 282 responses to encountered external magnetic fields.

Figure 8:
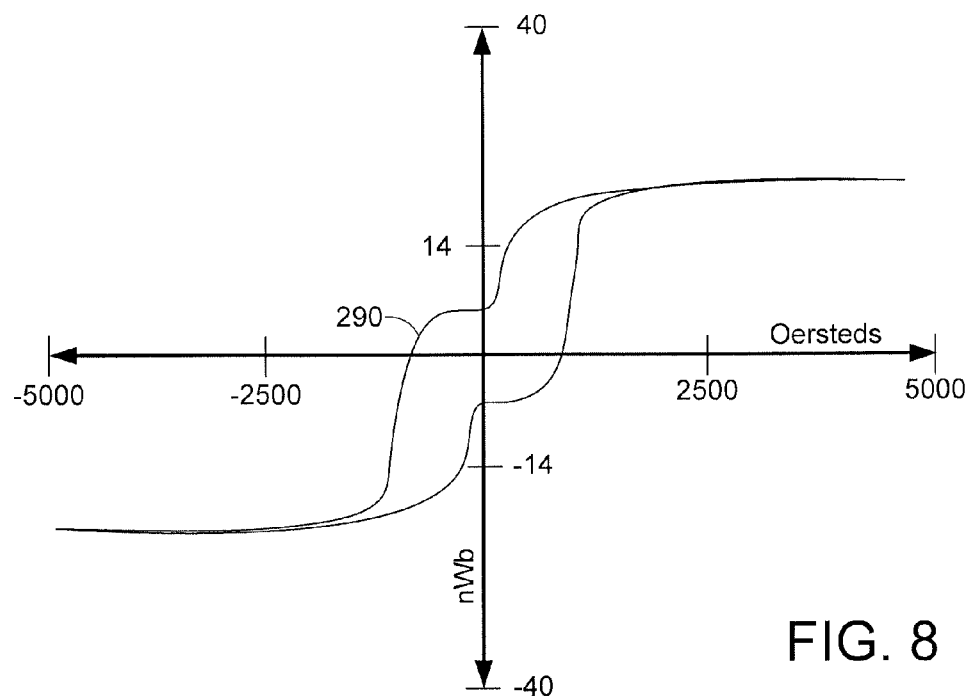
FIG. 8 plots operational data from various example magnetic elements operated in accordance with some embodiments.

FIG. 8 graphs another hysteresis loop for an example base lamination contacting a DCS in accordance with some embodiments. While hard and easy axis applied magnetic fields were conducted, nearly indiscernible differences were found in the magnetic shield when encountering magnetic fields oriented parallel or perpendicular to an air bearing. Hence, a single solid line 290 represents the influence an additional magnetization provided by the DCS has on a magnetic shield plated atop a tuned base lamination. As displayed, the supplemental magnetization of the DCS rotates respectively with the magnetization of the shield although they are coupled together via the base lamination, which keeps the magnetic coercivity of the shield relatively low.

Figure 9:
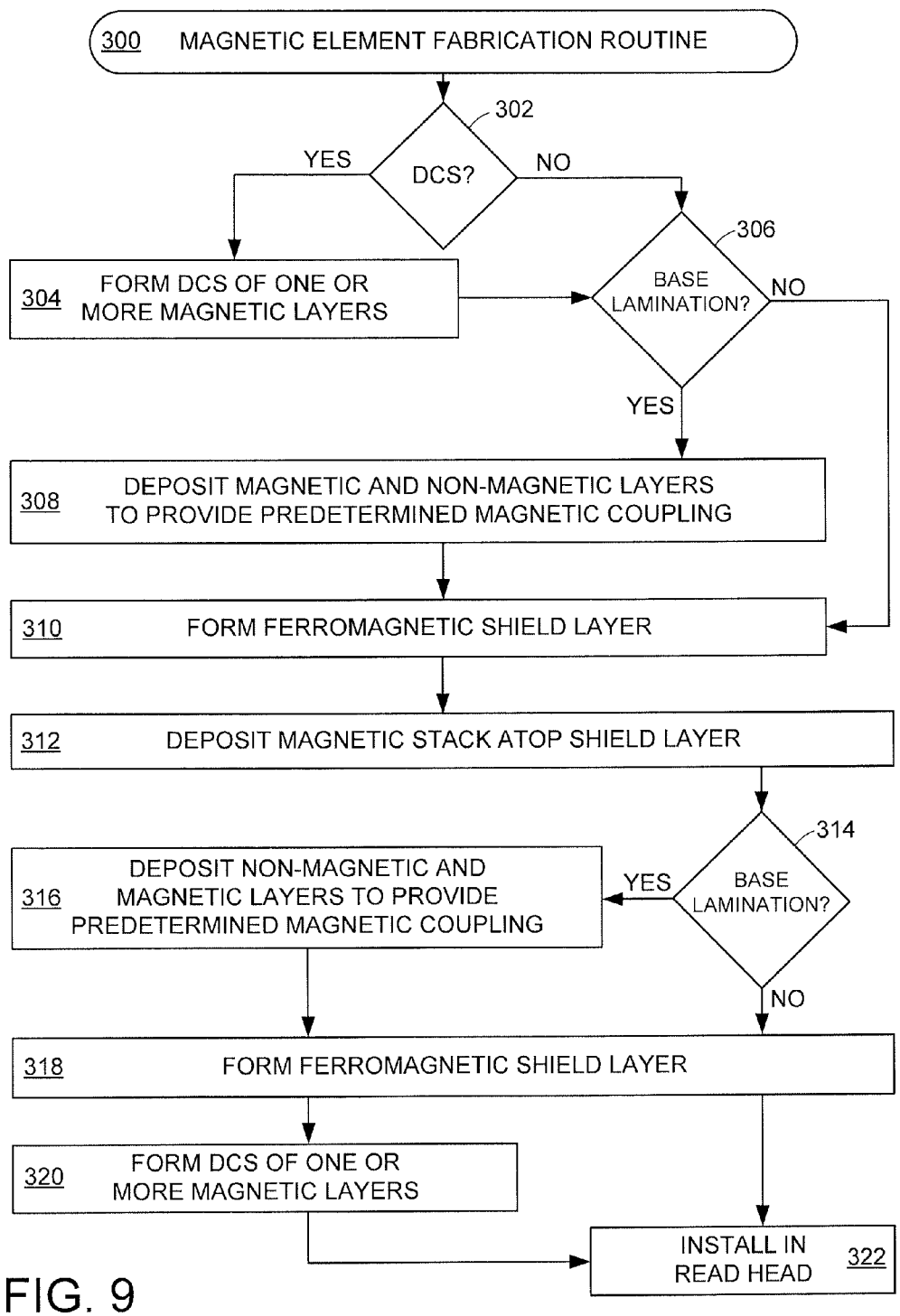
FIG. 9 is a flowchart of an exemplary magnetic element fabrication routine carried out in accordance with various embodiments.

The ability to tune magnetic shield performance through various base lamination configurations can allow for a magnetic shield to be adapted to a diverse variety of data storage environments. Such tuning can occur at any time and may adhere to a predetermined fabrication routine, such as the example read head fabrication routine 300 of FIG. 9. Initially, the routine 300 decides if a DCS element is to be incorporated into the read head in decision 302. Step 304 then proceeds to form a DCS element with one or more magnetic layers if a DCS element is chosen from decision 302. At the conclusion of DCS formation or if no DCS element is to be created from decision 302, decision 306 next determines if a base lamination is to be included into the read head.

In the event a base lamination is to be used, step 308 deposits magnetic and non-magnetic materials with predetermined thicknesses to provide magnetic coupling within the base lamination. The construction of the base lamination in step 308, or if no base lamination is to be constructed from decision 306, routine 300 advances to step 310 where a ferromagnetic shield layer is formed. In various embodiments, the ferromagnetic shield layer is plated atop the base lamination in step 310 to provide predetermined magnetic coercivity and uniaxial anisotropy, although other deposition techniques, such as oblique incidence angle sputtering can be used alone or in conjunction with plating.

With the bottom shield constructed, step 312 deposits various magnetic stack layers that are tuned to provide a measurable response to encountered external data bits, such as the spin valve and trilayer stacks of FIGS. 2A and 2B. Decision 314 next begins to form the top shield by evaluating if a base lamination is to be used. An affirmative answer to decision 314 advances to step 316 where magnetic and non-magnetic layers with predetermined magnetic coupling are deposited. It should be noted that the base lamination constructed in step 316 may be the same, or different, than the base lamination formed in step 308.

Formation of the base lamination, or if no base lamination is chosen from decision 314, proceeds to construct a top ferromagnetic shield layer in step 318 that may be similar or dissimilar than the ferromagnetic shield layer formed in step 310. The completion of the shield layer in step 318 can next form DCS element in step 320 or terminate the fabrication routine 300 with installation of the shielded magnetic stack into a read head, such as a slider, head gimbal assembly, and actuator generally shown in FIG. 1, in step 322. Even if a DCS element is to be constructed, step 320 deposits and shapes one or more magnetic layers into a predetermined configuration before installing the magnetic stack, shield, and DCS element(s) into the read head in step 322.

Through the various steps and decisions of routine 300, a read head can be created with optimized magnetic characteristics, especially shielding characteristics like coercivity and uniaxial anisotropy. However, routine 300 is not limited to the steps and decisions provided in FIG. 9 as an unlimited variety of steps and processes may be changed, omitted, and added, at will. For instance, additional steps may operate to shape any DCS elements by creating reduced thickness regions that contact the base lamination or shield layer portion of the bottom and top shields, respectively.

The tuned construction of a magnetic shield with low magnetic coercivity and relatively high uniaxial anisotropy can provide optimized magnetic stack operation in data storage environments with large amounts of stray magnetic fields. The ability to provide the predetermined coercivity and anisotropy of the magnetic shield through tuned magnetic coupling of an underlying base lamination allows the magnetic shield layer to be efficiently produced without increased processing or fabrication complexity. Moreover, the magnetic coupling of the base lamination can be configured in a variety of manners to precisely control the number, type, and strength of magnetizations in the base lamination, which corresponds with predetermined magnetic coercivity and uniaxial anisotropy once the magnetic shield material is plated on top of the base lamination.

It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a magnetic stack contacting a magnetic shield, the magnetic shield positioned atop a base lamination and having a predetermined anisotropy and magnetic coercivity corresponding to the base lamination, the base lamination comprising a non-magnetic spacer disposed between first and second bilayers.

2. The apparatus of claim 1, wherein the first and second bilayers each comprises first and second sub-layers.

3. The apparatus of claim 2, wherein the first sub-layer comprises a Ni alloy.

4. The apparatus of claim 2, wherein the second sub-layer comprises a Co alloy.

5. The apparatus of claim 2, wherein the second sub-layer of each bilayer contacts the non-magnetic spacer layer.

6. The apparatus of claim 2, wherein the first and second sub-layers are different materials.

7. The apparatus of claim 2, wherein the first and second sub-layers have different uniform thicknesses.

8. The apparatus of claim 1, wherein the predetermined anisotropy is over 400.0 Oersted.

9. The apparatus of claim 8, wherein the predetermined magnetic coercivity is 5.0 Oersted or less.

10. The apparatus of claim 1, wherein the magnetic shield comprises one of the following materials: NiFe, NiFeCr, NiFeMo, NiFeW, CoNiFe, CoZrNb, and FeSiAl.

11. The apparatus of claim 1, wherein the magnetic stack comprises a spin valve with pinned and free magnetizations on opposite sides of a non-magnetic spacer.

12. The apparatus of claim 1, wherein the magnetic stack comprises a trilayer with dual free magnetizations on opposite sides of a non-magnetic spacer and without a pinned magnetization.

13. The apparatus of claim 1, wherein the magnetic shield is plated atop the base lamination.

14. The apparatus of claim 1, wherein the magnetic shield is proximal a reference structure of the magnetic stack and distal a free layer of the magnetic stack.

15. A read head comprising a magnetic stack contacting first and second magnetic shields, the first magnetic shield positioned atop a first base lamination and having a predetermined first uniaxial anisotropy and magnetic coercivity corresponding to the first base lamination, the second magnetic shield positioned atop a second base lamination and having a predetermined second uniaxial anisotropy and magnetic coercivity corresponding to the second base lamination.

16. The read head of claim 15, wherein the first base lamination differs from the second base lamination.

17. The read head of claim 15, wherein the first base lamination is positioned between the magnetic stack and first magnetic shield and the second magnetic shield is disposed between the second base lamination and the magnetic stack.

18. The read head of claim 15, wherein the first base lamination has four magnetic sub-layers and the second base lamination has three magnetic sub-layers.

19. A data transducer comprising a magnetic stack contacting a magnetic shield, the magnetic shield positioned atop a base lamination and having a predetermined anisotropy and magnetic coercivity corresponding to the base lamination, the base lamination contacting a domain control structure having a reduced thickness portion.

20. The data transducer of claim 19, wherein the reduced thickness portion is disposed between extended thickness portions of the domain control structure.

* * * * *